United States Patent
Baker et al.

(10) Patent No.: US 9,099,606 B2
(45) Date of Patent: Aug. 4, 2015

(54) METHOD OF FORMING $CU(IN_xGA_{1-x})S_2$ AND $CU(IN_xGA_{1-x})SE_2$ NANOPARTICLES

(71) Applicants: Colin C. Baker, Alexandria, VA (US); Woohong Kim, Lorton, VA (US); Shyam S. Bayya, Ashburn, VA (US); Jasbinder S. Sanghera, Ashburn, VA (US); Ishwar D. Aggarwal, Charlotte, NC (US)

(72) Inventors: Colin C. Baker, Alexandria, VA (US); Woohong Kim, Lorton, VA (US); Shyam S. Bayya, Ashburn, VA (US); Jasbinder S. Sanghera, Ashburn, VA (US); Ishwar D. Aggarwal, Charlotte, NC (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 14/191,486

(22) Filed: Feb. 27, 2014

(65) Prior Publication Data
US 2014/0273336 A1    Sep. 18, 2014

Related U.S. Application Data

(60) Provisional application No. 61/786,664, filed on Mar. 15, 2013.

(51) Int. Cl.
  *H01L 21/00*    (2006.01)
  *H01L 31/18*    (2006.01)
  *H01L 31/032*    (2006.01)

(52) U.S. Cl.
  CPC .......... *H01L 31/18* (2013.01); *H01L 31/0322* (2013.01)

(58) Field of Classification Search
  CPC .................. H01L 31/18; H01L 31/0322
  USPC ................................ 438/57, 66, 95
  See application file for complete search history.

(56) References Cited

U.S. PATENT DOCUMENTS

2010/0139486 A1*    6/2010    Smirniotis et al. .............. 95/139

FOREIGN PATENT DOCUMENTS

WO    WO 2009064592 A1 *    5/2009

* cited by examiner

*Primary Examiner* — Brook Kebede
(74) *Attorney, Agent, or Firm* — US Naval Research Laboratory; Rebecca L. Forman

(57) ABSTRACT

A method for synthesizing $Cu(In_xGa_{1-x})S_2$ and $Cu(In_xGa_{1-x})Se_2$ nanopowders using flame spray pyrolysis to form solar cell absorber materials. The flame spray product is the oxide nanoparticles of the absorber materials (copper indium gallium oxide). The oxide nanoparticles may be deposited directly onto glass substrates. The oxide nanoparticles are then sulfurdized or selenized with a post deposition anneal directly on the substrate to form the absorber layer for a solar cell device.

12 Claims, 3 Drawing Sheets

METHOD OF FORMING CU(IN$_x$GA$_{1-x}$)S$_2$ AND CU(IN$_x$GA$_{1-x}$)SE$_2$ NANOPARTICLES

PRIORITY CLAIM

The present application is a non-provisional application claiming the benefit of U.S. Provisional Application No. 61/786,664, filed on Mar. 15, 2013 by Colin C. Baker et al., entitled "Method of Forming Cu(In$_x$Ga$_{1-x}$)Se Nanoparticles," the entire contents of which is incorporated herein by reference.

BACKGROUND OF THE INVENTION

1. Field of the Invention

The present invention relates to synthesizing Cu(In$_x$Ga$_{1-x}$)S$_2$ and Cu(In$_x$Ga$_{1-x}$)Se$_2$ nanoparticles and, more specifically, to synthesizing these nanoparticles using flame spray pyrolysis.

2. Description of the Prior Art

Thin film chalcopyrite solar cell absorber layers of CuInSe$_2$, CuInS$_2$, Cu(In$_x$Ga$_{1-x}$)S$_2$, and Cu(In$_x$Ga$_{1-x}$)Se$_2$, or their mixtures, generally known as CIS or CIGS, have been investigated since the 1980's. They have efficiencies superior to CdTe and can be produced using non-vacuum technology, thus cutting down on costs. The record efficiency for a chalcopyrite based solar device to date is 19.9%, and the theoretical efficiency is about 30%. The band gap of these materials can be adjusted from 1.0-2.4 eV by controlling the ratio of In to Ga. Some of the methods to produce these materials have included coating inks onto substrates followed by a post deposition anneal in H$_2$S, or H$_2$Se, electro deposition of precursors, paste coating, and chemical spray pyrolysis. In many cases the precursors in these methods require the use of pyridine, a highly hazardous material. Furthermore, a difficulty for these processes is that it is difficult to obtain dense films, where a film thickness of 1-2 µm should be obtained.

Flame synthesis techniques are non-vacuum gas phase processes that have been shown to be very effective in producing high purity oxide nanoparticles on an industrial scale. In these processes precursor materials are either volatile, or are aerosolized by various means. Upon being sprayed, precursor droplets evaporate and undergo combustion in the flame. The aerosol species that are formed are rapidly quenched as they leave the reaction zone, leading to the formation of oxide nanoparticles.

A method for synthesizing Cu(In$_x$Ga$_{1-x}$)S$_2$ and Cu(In$_x$Ga$_{1-x}$)Se$_2$ nanoparticles using flame spray pyrolysis with a post deposition sulfurdization or selenization to form a solar cell absorber layer has never been demonstrated before. Other methods to synthesize CIGS nanoparticles require either expensive vacuum equipment, or many processing steps, often with harmful chemicals and application onto substrates with more time consuming and involved methods such as doctor blade techniques.

BRIEF SUMMARY OF THE INVENTION

The aforementioned problems are overcome in the present invention which provides a method of forming Cu(In$_x$Ga$_{1-x}$)S$_2$ and Cu(In$_x$Ga$_{1-x}$)Se$_2$ nanoparticles by performing flame spray pyrolysis on copper, indium and gallium precursor materials to form a copper indium gallium oxide that is sulfurdized or selenized by heating in H$_2$S or H$_2$Se gas. Also disclosed is the related nanoparticles made by this method and the related method of making a solar cell absorber layer.

The present invention provides a method of forming Cu(In$_x$Ga$_{1-x}$)S$_2$ and Cu(In$_x$Ga$_{1-x}$)Se$_2$ chalcopyrite solar cell absorber layer nanoparticles through deposition with flame spray pyrolysis and post deposition treatment in an H$_2$S or H$_2$Se environment. Nanoparticles of these materials have never been produced by this method and are an excellent candidate as the absorber layer in solar cell devices. The technique is a non-vacuum process, and the precursor materials are non-harmful chemicals, which is a distinct advantage over other processes. The present invention uses flame spray pyrolysis to produce CIGS nanopowders with a post synthesis treatment in flowing sulfur or selenium atmospheres. This synthesis method has never been reported for CIGS absorber layers.

These and other features and advantages of the invention, as well as the invention itself, will become better understood by reference to the following detailed description, appended claims, and accompanying drawings.

DETAILED DESCRIPTION OF THE INVENTION

Figure 1:
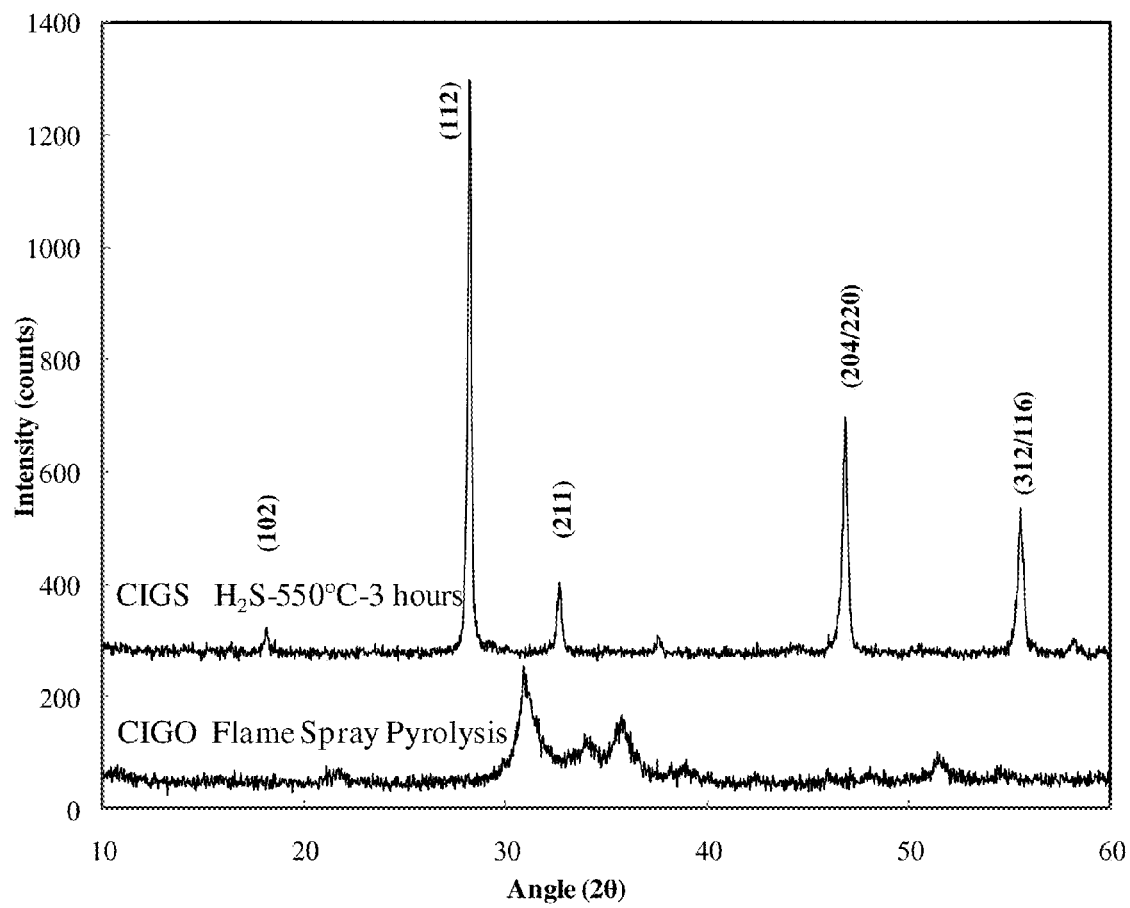
FIG. 1 shows XRD patterns for a copper indium gallium oxide sample prepared by flame spray pyrolysis and a sample with post deposition sulfurdization.

The present invention provides a method for synthesizing Cu(In$_x$Ga$_{1-x}$)S$_2$ and Cu(In$_x$Ga$_{1-x}$)Se$_2$ nanopowders using the technique of flame spray pyrolysis to form solar cell absorber layers. Precursor materials, including a copper precursor, an indium precursor, and a gallium precursor, are used for the flame spray pyrolysis. Cu(NO$_3$)$_2$.xH$_2$O, Ga(NO$_3$)$_3$.xH$_2$O, and In(NO$_3$)$_3$.xH$_2$O dissolved in ethanol may be used as precursor materials. The flame spray product is the oxide of these precursor materials, denoted as CIGO (copper indium gallium oxide). The CIGO is sulfurdized by heating in H$_2$S gas to form Cu(In$_x$Ga$_{1-x}$)S$_2$ nanopowders or selenized by heating in H$_2$Se gas to form Cu(In$_x$Ga$_{1-x}$)Se$_2$ nanopowders.

The oxide nanopowders can be deposited directly onto a glass substrate, such as a molybdenum coated soda lime glass substrate. The oxide nanopowders are then sulfurdized or selenized with a post deposition anneal directly on the substrate to form the absorber layer for a solar cell device. A commercial flame spray pyrolysis system can be used to synthesize the nanoparticles.

EXAMPLES

The liquid precursor was fed through a commercially available flame spray apparatus nozzle at flow rates of 5 ml/min with the aid of an O$_2$ dispersion gas/oxidant that had a flow rate of 5 L/min. Small pilot flames ignited from flowing 1.5 L/min CH$_4$ and 3 L/min O$_2$ forming a ring pattern were used as the flame ignition source and as a supporting flame for the larger central flame. The pilot flame ringlet surrounded a central capillary tube that sprayed the precursor solution mixed with an oxygen dispersion gas to form precursor droplets that underwent combustion in the large central flame. The powders were either deposited directly on molybdenum coated sodalime glass substrates heated by the flame to 400° C., or collected on glass fiber filter paper mounted in a commercial water cooled stainless steel collection chimney. For the case of deposition on the filter media the powders were removed by scraping with a Teflon scraper.

The copper precursor used was $Cu(NO_3)_2 \cdot xH_2O$, the indium precursor used was $In(NO_3)_3 \cdot xH_2O$, and the gallium precursor was $Ga(NO_3)_3 \cdot xH_2O$. All precursors were mixed in the appropriate amounts to form $Cu(In_{0.7}Ga_{0.3})$-oxide upon deposition. However, the ratio of Ga to In can be modified in the precursor concentration to vary the band gap of the final CIGS film.

All chemicals were purchased from Sigma Aldrich and were 99.999% pure. The resultant CIG-oxide nanopowder was then sulfurdized by heating the material at 550° C. in 20 ccm $H_2S$ gas for 3 hours. Sulfurdization was also carried out by vaporizing solid sulfur.

The material phase for the particles was characterized with x-ray diffraction (XRD) in a Scintag XDS 2000 diffractometer using Cu-kα radiation. The particle size was characterized using a JEOL JEM 2200FS transmission electron microscope working at 200 kV. The film coating was characterized with JEOL SEM and EDS was performed to determine the atomic percent of the individual constituents.

Example 1

This example gives an XRD pattern for the CuInGa-Oxide precursor film after flame spray deposition on molybdenum coated sodalime glass substrate and a pattern for the same film after sulfurdization with $H_2S$ gas at 20 ccm, 550° C. for 3 hours (FIG. 1). The precursor is an unknown phase and is a mixture of oxides as there is no known single phase compound with this stoichiometry. The sulfurdized phase is indexed to $CuInGaS_2$.

Example 2

Figure 2:
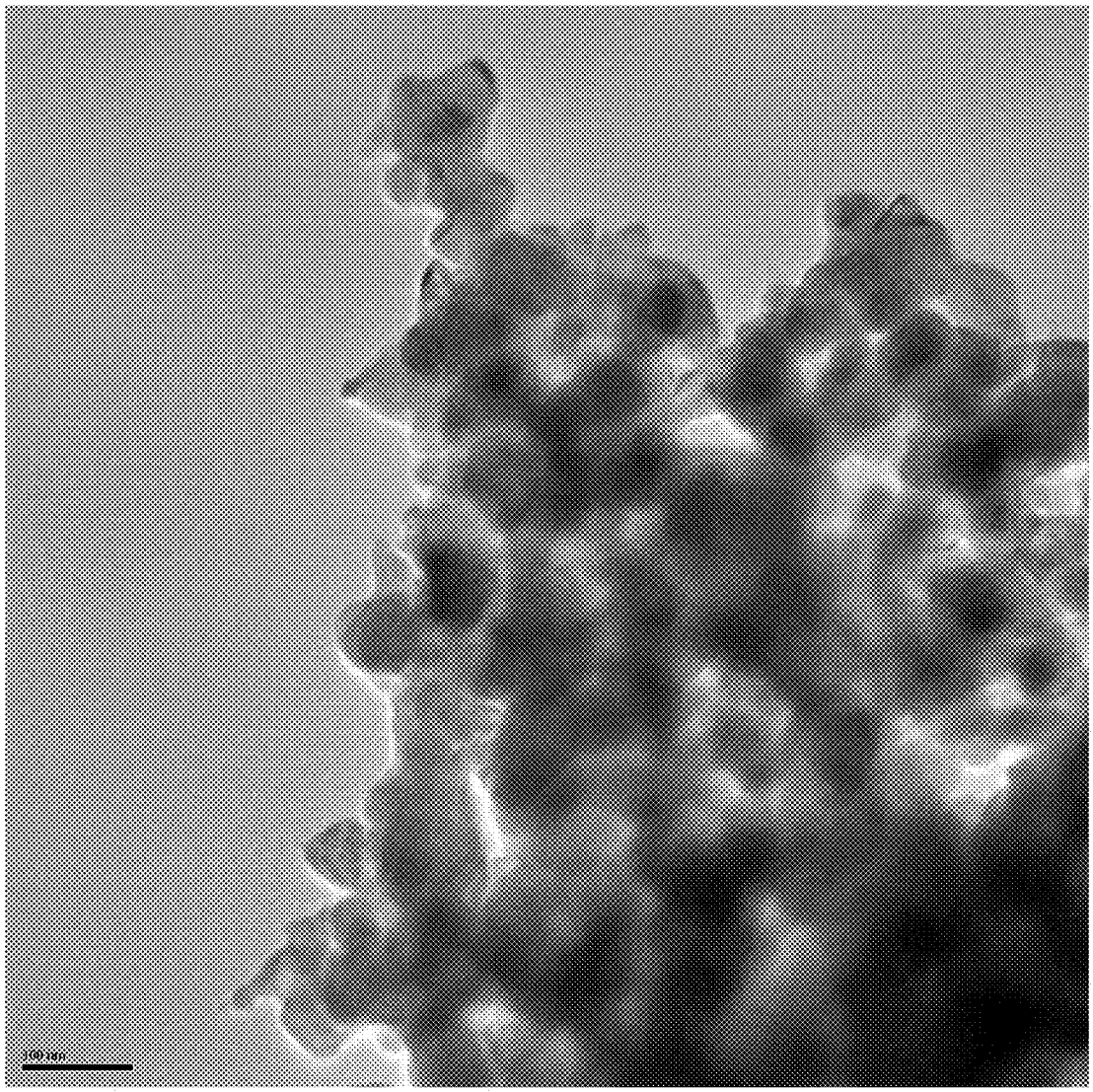
FIG. 2 is a TEM image of a cluster of CIGS nanoparticles.

This example gives a TEM image for a representative sample of a cluster of $CuInGaS_2$ nanoparticles (FIG. 2). The nanoparticles range from 50-100 nm in diameter.

Example 3

Figure 3:
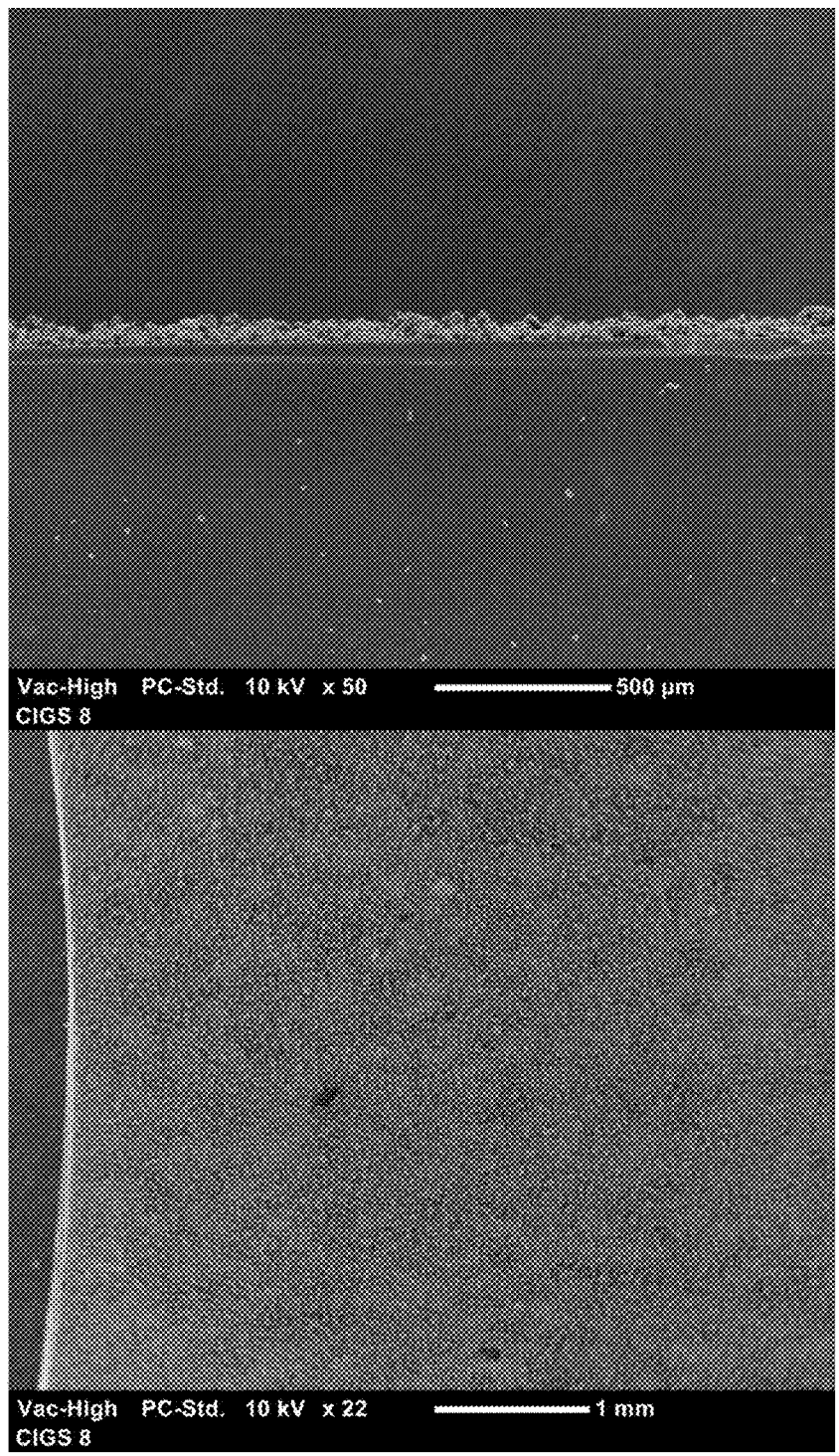
FIG. 3 shows SEM images of CIGS nanoparticles. Copper indium gallium oxide nanoparticles were deposited directly on a molybdenum coated sodalime glass substrate and given a post deposition anneal in sulfur to form CIGS. A cross section of a typical film is given (top) and viewed directly (bottom).

This example gives an SEM image for the cross section of a CIGO thin film deposited on molybdenum coated sodalime glass substrate and subsequently sulfurdized (FIG. 3). The CIGS absorber layer varies between 50-75 μm thick.

The above descriptions are those of the preferred embodiments of the invention. Various modifications and variations are possible in light of the above teachings without departing from the spirit and broader aspects of the invention. It is therefore to be understood that the claimed invention may be practiced otherwise than as specifically described. Any references to claim elements in the singular, for example, using the articles "a," "an," "the," or "said," is not to be construed as limiting the element to the singular.

What is claimed as new and desired to be protected by Letters Patent of the United States is:

1. A method of forming copper indium gallium sulfide and copper indium gallium selenide nanoparticles, comprising:
    performing flame spray pyrolysis on precursor materials to form copper indium gallium oxide, wherein the precursor materials comprise a copper precursor, an indium precursor, and a gallium precursor; and
    sulfurdizing or selenizing the copper indium gallium oxide by heating the copper indium gallium oxide in $H_2S$ or $H_2Se$ gas.

2. The method of claim 1, wherein the precursor materials comprise $Cu(NO_3)_2 \cdot H_2O$, $Ga(NO_3)_3 \cdot H_2O$, and $In(NO_3)_3 \cdot H_2O$.

3. The method of claim 1, wherein after performing flame spray pyrolysis, the precursor materials form $Cu(In_{0.7}Ga_{0.3})$-oxide.

4. The method of claim 1, wherein the copper indium gallium oxide is deposited onto a substrate before sulfurdizing or selenizing.

5. The method of claim 1, wherein the copper indium gallium oxide is collected on filter paper before sulfurdizing or selenizing.

6. Copper indium gallium sulfide or copper indium gallium selenide nanoparticles made by the method comprising:
    performing flame spray pyrolysis on precursor materials to form copper indium gallium oxide, wherein the precursor materials comprise a copper precursor, an indium precursor, and a gallium precursor; and
    sulfurdizing or selenizing the copper indium gallium oxide by heating the copper indium gallium oxide in $H_2S$ or $H_2Se$ gas.

7. The nanoparticles of claim 6, wherein the precursor materials comprise $Cu(NO_3)_2 \cdot H_2O$, $Ga(NO_3)_3 \cdot H_2O$, and $In(NO_3)_3 \cdot H_2O$.

8. The nanoparticles of claim 6, wherein after performing flame spray pyrolysis, the precursor materials form $Cu(In_{0.7}Ga_{0.3})$-oxide.

9. The nanoparticles of claim 6, wherein the copper indium gallium oxide is deposited onto a substrate before sulfurdizing or selenizing.

10. The nanoparticles of claim 6, wherein the copper indium gallium oxide is collected on filter paper before sulfurdizing or selenizing.

11. A method of forming a solar cell absorber layer, comprising:
    performing flame spray pyrolysis on precursor materials comprising $Cu(NO_3)_2 \cdot H_2O$, $Ga(NO_3)_3 \cdot H_2O$, and $In(NO_3)_3 \cdot H_2O$ to form copper indium gallium oxide;
    depositing the copper indium gallium oxide onto a substrate; and
    sulfurdizing or selenizing the deposited copper indium gallium oxide by heating the copper indium gallium oxide in $H_2S$ or $H_2Se$ gas.

12. The method of claim 11, wherein after performing flame spray pyrolysis, the precursor materials form $Cu(In_{0.7}Ga_{0.3})$-oxide.

* * * * *